United States Patent [19]
Canham et al.

[11] Patent Number: 5,561,304
[45] Date of Patent: Oct. 1, 1996

[54] ELECTROLUMINESCENT SILICON DEVICE

[75] Inventors: Leigh T. Canham; Weng Y. Leong; Timothy I. Cox, all of Worcestershire, United Kingdom

[73] Assignee: The Secretary of State for Defence in Her Britannic Majesty's Government of the United Kingdom of Great Britain and Northern Ireland, London, England

[21] Appl. No.: 129,208

[22] PCT Filed: Mar. 25, 1992

[86] PCT No.: PCT/GB92/00547

§ 371 Date: Oct. 8, 1993

§ 102(e) Date: Oct. 8, 1993

[87] PCT Pub. No.: WO92/19084

PCT Pub. Date: Oct. 29, 1992

[30] Foreign Application Priority Data

Apr. 17, 1991 [GB] United Kingdom ............ 9108176

[51] Int. Cl.⁶ .................................................. H01L 33/00
[52] U.S. Cl. ............................ 257/103; 257/14; 313/503
[58] Field of Search ............................... 257/103, 14, 22, 257/16; 313/498, 503, 499

[56] References Cited

U.S. PATENT DOCUMENTS

| | | | |
|---|---|---|---|
| 3,030,542 | 4/1962 | Knochel | 313/108 |
| 3,082,175 | 3/1963 | Thornton | 252/301.6 |
| 3,621,321 | 11/1971 | Williams | 313/108 |
| 5,317,236 | 5/1994 | Zavracky et al. | 315/169.3 |
| 5,324,965 | 6/1994 | Tompsett et al. | 257/103 |

OTHER PUBLICATIONS

Steiner et al.; "Blue and Green Electroluminescence From a Porous Silicon Device;" Electron Device Letters., vol. 14, No. 7, Jul. 1993.

Namavar et al.; "Visible Electroluminescence From Porous Silicon NP Heterojunction Diodes;" Appl. Phys. Lett. 60 (20), 18 May 1992; pp. 2514–2516.

Koshida et al.; "Visible Electroluminescence From Porous Silicon;" Appl. Phys. Lett. 60 (3), 20 Jan. 1992; pp. 347–349.

Lehmann et al.; "Porous Silicon Formation: A Quantum Wire Effect;" Appl. Phys. Lett. 58 (8), 25 Feb. 1991; pp. 856–858.

Bassous et al.; "Characterization of Microporous Silicon Fabricated by Immersion Scanning;" Mat. Res. Soc. Symp. Proc. vol. 256, 1992; pp. 23–26.

Richter et al.; "Visible Electroluminescence of Porous Silicon Devices With a Solid State Contact;" Mat. Res. Soc. Symp. Proc., vol. 256, 1992; pp. 209–214.

Harvey et al.; "Optical Studies of Electroluminescent Structures From Porous Silicon;" Mat. Res. Soc. Symp. Proc., vol. 263, 1993; pp. 395–399.

(List continued on next page.)

*Primary Examiner*—Sara W. Crane
*Attorney, Agent, or Firm*—Nixon & Vanderhye P.C.

[57] ABSTRACT

An electroluminescent silicon device (10) includes a silicon structure (12) which comprises a bulk silicon layer (14) and a porous silicon layer (16). The porous layer (16) has merged pores (20) which define silicon quantum wires (18). The quantum wires (18) have a surface passivation layer (22). The porous layer (16) exhibits photoluminescence under ultra-violet irradiation. The porous layer (16) is pervaded by a conductive material such as an electrolyte (24) or a metal (48). The conductive material (24) ensures that an electrically continuous current path extends through the porous layer (16); it does not degrade the quantum wire surface passivation (22) sufficiently to render the quantum wires (18) non-luminescent, and it injects minority carriers into the quantum wires. An electrode (26) contacts the conductive material (24) and the bulk silicon layer has an Ohmic contact (28). When biased the electrode (26) is the anode and the silicon structure (12) is the cathode. Electroluminescence is then observed in the visible region of the spectrum.

31 Claims, 5 Drawing Sheets

OTHER PUBLICATIONS

The Physical Review, vol. 100, No. 2, issued 1955, Oct. 15, Roger Newman "Visible Light from a Silicon p–n Junction" pp. 700–703 also vol. 102, No. 2 issued 1956, Apr. 15, A. G. Chynoweth, K. G. McKay Photon Emission from Avalanche Breakdown in Silicon pp. 365–376.

Journal of Applied Physics vol. 56, No. 2, issued 1984, Jul. 15, D. J. Dimaria et al. "Electroluminescence studies in silicon dioxide films containing tiny silicons island" pp. 401 to 416.

Journal Of The Electro–Chemical Society, vol. III, No. 11, issued Nov. 1964, Palto Alto, California, Wordon Warning "Luminescence" p. 1259.

Soviet Electrochemistry, vol. 20, No. 1 issued Jan. 1984, A. P. Baraban et al., "Electroluminescence Spectra in the System–Silicon Dioxide Electrolyte", pp. 507–509.

Journal of the Electro–Chemical Society, vol. 107, No. 9, issued Sep. 1960, Allen Gee "Electrochemi–luminescence at a Silicon Anode in Contact with an Electrolyte", pp. 787–788.

Applied Physics Letters, vol. 57, No. 10, issued 1990, Sep. 03, L. T. Canham "Silicon quantum wire array fabrication by electro–chemical and chemical disolution of wafers" pp. 1046–1048.

Physical Review Letters, vol. 57, No. 2, issued 1986, Jul. 14, E. Yablonovitch et al, "Unusually Low Surface–Recombination Velocity on Silicon and germanium Surfaces" pp. 249–252.

Solid–State Electronics, vol. 12, No. 3, issued Mar. 1969, A. Y. C. Yu et al. "Minority Carrier Injection of Metal–Silicon Contacts" pp. 155–160.

Solid–State Electronics vol. 16, No. 3, issued Mar. 1973, H. C. Card et al.

Journal of Applied Physics vol. 53, No. 1, issued Jan. 1992, Philip J. Caplan et al pp. 541–545.

Journal of the Electro–Chemical Society, vol. 132, No. 10, pp. 2513–2514.

ELECTROLUMINESCENT SILICON DEVICE

BACKGROUND OF THE INVENTION

1. Field of the Invention

This invention relates to an electroluminescent silicon device.

2. Discussion of Prior Art

There is considerable interest in the production of silicon-based or silicon-compatible light emitting devices for use in opto-electronic integrated circuits. In the course of work to develop such devices, visible electroluminescence has been observed from silicon in a variety of circumstances some of which are described briefly below.

R. Newman in "Visible Light from Silicon p-n Junction", Phys. Rev. Vol 100, p700 (1955) and Chynoweth and McKay in "Photon Emission from Avalanche Breakdown in Silicon", Phys. Rev., Vol 102, P369 (1956) describe very broad band electroluminescent emission when bulk silicon p-n junctions are reverse biased to "avalanche breakdown". The emission extends from about 3 eV to below 1 eV and is of very low efficiency, typically $10^{-5}$ photons per electron.

Visible electroluminescence has also been observed from metal-silicon dioxide-silicon structures in which the silicon dioxide layer contains very small silicon crystallites (less than 50 Å wide). This is described by Di Maria et al in "Electroluminescence Studies in Silicon Dioxide Films Containing Tiny Silicon Islands", J. Appl. Phys., Vol 56, p401 (1984). Again the emission has very low efficiency, typically less than $10^{-6}$ photons per electron.

W. Waring and E. A. Benjamin in "Luminesence during Anodic Oxidation of Silicon", J. Electrochem. Soc., Vol 11, p1256 (1964) describe visible electroluminescence from bulk silicon surfaces when they are anodically biased in electrolytes capable of oxidising the surface. Once again the efficiency of the emission is low, and in addition it is unstable since it results from chemical changes at the relevant interface. More recent work in this field is described by A P Baraban et al in "Electroluminescence Spectra in the System Silicon-Silicon Dioxide-Electrolyte", Soviet Electrochem., Vol 20, p507 (1984).

A. Gee in "Electrochemiluminescence at a Silicon Anode in Contact with an Electrolyte", J. Electrochem. Soc., Vol 107, p787 (1960) describes visible electroluminescence from chemically produced stain films on bulk p-type silicon under anodic bias in many electrolytes. The emission of the light results from the anodic oxidation of the film and is irreversible.

The above approaches to obtaining electroluminescence from silicon therefore have a number of drawbacks, primarily very low efficiency or irreversibility. These drawbacks render the approaches unsuitable for producing practical electroluminescent silicon devices.

Recently L. T. Canham in "Silicon Quantum Wire Array Fabrication by Electrochemical and Chemical Dissolution of Wafers", Appl. Phys. Lett., Vol 57, p1046, (1990), describes the fabrication of free standing silicon quantum wire arrays in surface layers of bulk silicon wafers. Free standing wires are taken to be wires which are not immersed or embedded in another material. The wires themselves need not be isolated columns but may be interlinked. Quantum wires are wires in which the diameter is sufficiently small such that quantum confinement of carriers occurs within them. The result of this is that the bandgap of the material concerned, in this case silicon, is significantly increased. Visible red photoluminescence is emitted from these quantum wire arrays under appropriate irradiation. These arrays are however highly resistive and therefore unlikely to yield significant electroluminescence at the low applied bias voltages required for conventional integrated circuitry. This work has been reproduced elsewhere, and workers have gone on to suggest that appropriately doped free standing silicon quantum wires would provide an array of lower resistivity capable of supporting appreciable current and exhibiting electroluminescence. Despite this, there has been no report of silicon quantum wires which are doped appropriately for the above electroluminescent behaviour to be exhibited.

SUMMARY OF THE INVENTION

It is an object of the invention to provide an alternative form of electroluminescent silicon device.

In one aspect, the present invention provides an electroluminescent silicon device characterized in that it includes silicon quantum wires and conducting means for supplying an electrical current to the quantum wires, the quantum wires and the conducting means being arranged in combination to produce electroluminescence.

In another aspect, the present invention provides an electroluminescent silicon device characterised in that it includes a composite structure of silicon material incorporating a porous region containing surface passivated quantum wires, and conductive material within the porous region, wherein the conductive material:

(a) is arranged to enhance conduction through the quantum wires, (b) does not degrade the quantum wire surface passivation sufficiently to render the quantum wires non-luminescent, and (c) is arranged to enhance the minority carrier density within the quantum wires.

The expressions "surface passivation" and "surface passivated" used herein relate to the creation of a surface with a low density of non-radiative recombination centres. Further details are obtainable from Phys Rev Letters, Vol 57, P 249, 1986.

Embodiments of the invention have been observed to exhibit electroluminescence at a low bias voltage with a degree of stability greatly exceeding that characterising prior art devices based on anodic oxidation of silicon.

In one aspect, the present invention provides an electroluminescent silicon device characterised in that it includes a composite structure of silicon material incorporating a porous region containing surface passivated quantum wires, and conductive material within the porous region, wherein the conductive material:

(a) is arranged to ensure that an electrically continuous current path extends through the porous region, (b) does not degrade the quantum wire surface passivation sufficiently to render the quantum wires non-luminescent, and (c) is arranged to inject minority carriers into the quantum wires.

In another aspect, the present invention provides an electroluminescent silicon device characterised in that it includes a composite structure comprising a porous silicon layer having quantum wires with surface passivation and a conductive material, which conductive material:

(a) forms an electrically continuous layer over the internal surface of the porous silicon layer, (b) does not significantly degrade the surface passivation of the porous silicon layer, and (c) is capable of efficiently injecting minority carriers into the quantum wires.

The composite structure is preferably capable of supporting a current density of at least 1 mAcm$^{-2}$ under a bias voltage of not more than 10 Volts, desirably not more than 5 Volts.

The conductive material may be an electrolyte, a metal or a semi-metal.

The porous silicon may be produced by creating pores in heavily doped n type or p type silicon material having a dopant impurity concentration which is greater than $1\times10^{18}$ cm$^{-3}$ and not greater than $1\times10^{21}$ cm$^{-3}$. It may alteratively be produced by creating pores in lightly doped n type or p type silicon material having a dopant impurity concentration in the range $1\times10^{11}$ cm$^{-3}$ to $1\times10^{18}$ cm$^{-3}$.

In an alternative aspect, the present invention provides a method of making an electroluminescent silicon device characterised in that it includes the formation of a composite structure comprising a porous silicon layer having quantum wires with surface passivation and a conducting material.

The formation of the composite structure may include electroplating of a metal into the porous silicon layer; alternatively it may include introduction of an electrolyte into the porous silicon layer.

In an alternative aspect, the present invention provides a method of making an electroluminescent silicon device characterised in that it includes:

(a) forming porous silicon incorporating quantum wires with surface passivation, and (b) pervading the porous silicon with a conductive material arranged to enhance electrical conduction therethrough without rendering the quantum wires non-luminescent.

The step of pervading the porous silicon with a conductive material may comprise an electrochemical procedure for introducing conductive material into the porous silicon; it may comprise electroplating metal into the porous silicon.

The step of forming the porous silicon may include creating pores in heavily doped n type or p type silicon material having a dopant impurity concentration which is greater than $1\times10^{18}$ cm$^{-3}$ and not greater than $1\times10^{21}$ cm$^{-3}$. The step of forming the porous silicon may alteratively include creating pores in lightly doped n type or p type silicon material having a dopant impurity concentration in the range $1\times10^{11}$ cm$^{-3}$ to $1\times10^{18}$ cm$^{-3}$.

The invention also provides an electroluminescent silicon device made by the foregoing method.

BRIEF DESCRIPTION OF THE DRAWINGS

In order that the invention may be more fully understood, embodiments thereof will now be described, by way of example only, with reference to the accompanying drawings, in which.

DETAILED DESCRIPTION OF PREFERRED EMBODIMENTS

Figure 1:
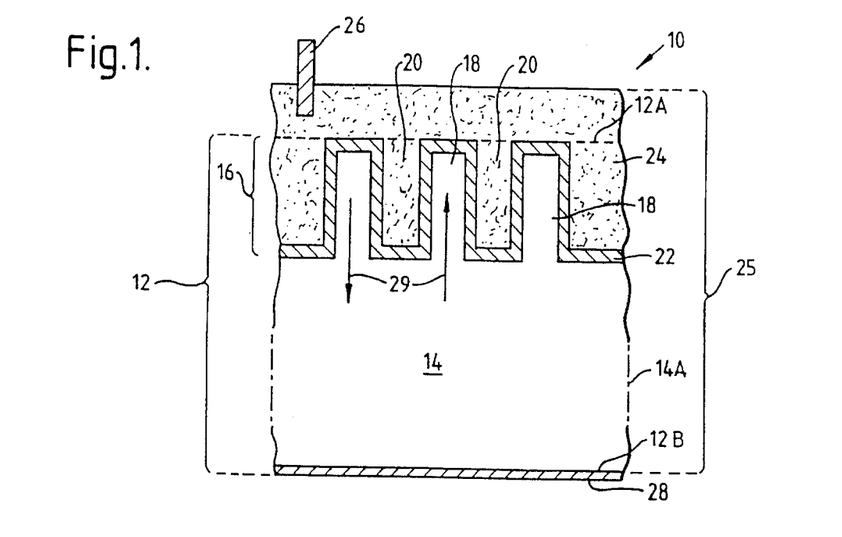
FIG. 1 illustrates schematically a vertical cross-section through an electroluminescent silicon device of the invention.

Referring to FIG. 1, a cross-section through an electroluminescent device of the invention is illustrated schematically. The device is indicated generally by 10. It incorporates a silicon structure 12 produced from a silicon wafer 400 μm thick with an original upper surface indicated by a dotted line 12A and a lower surface 12B. The silicon structure 12 incorporates a bulk silicon layer 14 and a porous silicon layer 16. The bulk silicon layer 14 is very nearly the same thickness as the original wafer, and is shown vertically foreshortened as indicated by chain lines 14A. The porous silicon layer 16 has a thickness in the range 0.1 to 50 μm. Strictly speaking, the expression "layer" is a misnomer, because the layers 14 and 16 are not produced by deposition, but this terminology is normal in the art for strata of a device. The fabrication of silicon structures such as the structure 12 is described by L T Canham in "Silicon Quantum Wire Array Fabrication by Electrochemical and Chemical Dissolution of Wafers", Appl. Phys. Lett., Vol 57, p1046, (1990). The porous silicon layer 16 has been subjected to sufficient dissolution to produce pore merging to define isolated quantum wires such as 18 with pores such as 20 therebetween. The quantum wires 18 are upstanding from the bulk silicon layer 14. They are not of a regular shape, nor of a constant width, and pore size is greater than wire size; the wires 18 and pores 20 are shown schematically in FIG. 1 in the interests of illustrational simplicity.

In a first embodiment, the device 10 incorporated a silicon structure 12 produced from a heavily doped n-type (n$^+$) silicon wafer with an arsenic donor concentration of $5\times10^{18}$ cm$^{-3}$ The porous layer 16 had a porosity of 78% and a thickness of 13 μm, and had been aged in air for 17 months after its formation. The porous silicon layer 16 emitted visible (orange) photoluminescence when irradiated with ultra violet light. As a result of ageing in air, exposed surfaces of the bulk layer 14 and wires 18 had an oxidised silicon hydride surface layer 22. A surface layer such as the layer 22 provides surface passivation for underlying silicon quantum wires because it has a low density of non-radiative recombination centres. The wires 18 were immersed in an electrolyte 24 to form a composite electrolyte/semiconductor structure 25 in combination with the silicon structure 12. The electrolyte 24 was an aqueous solution of $H_2SO_4:Na_2S_2O_8$ with concentrations 0.5M:0.1M. A platinum electrode 26 was immersed in the electrolyte 24, and an Ohmic electrical connection 28 was provided to the bulk silicon layer 14.

Porous silicon layers, consisting of quantum wires, such as the layer 16 have high electrical resistivity in the absence of an electrolyte 24. Treating the layer 16 as a continuous medium, an electrical resistivity can be defined, and typical values of resistivity several orders of magnitude greater than $10^6$ Ohmcm have been measured for it. Consequently, in the absence of an electrolyte 24, the silicon structure 12 is highly resistive in directions parallel to arrows 29 perpendicular to the layers 14 and 16. However, when the device 10 was biased such that the silicon structure 12 was negative and formed the cathode and the platinum electrode 26 was positive and formed the anode, the device passed an appreciable current density, of the order of a few mAcm$^{-2}$, at bias voltages of less than 5 volts. This bias polarity corresponded to a forward biased silicon structure 12. To determine current density, a geometrical area of 1 cm$^2$ of the upper surface of the porous layer 16 was exposed to electrolyte, all other surface regions of the structure 12 having been masked. Current flowing between the platinum electrode 26 and structure 12 was then a few mA. Current density was calculated as the ratio of current to geometrical area, ignoring internal surface area of pores. For bias voltages of the order of 1 Volt or greater, this embodiment of the device 10 emitted orange electroluminescence which was visible to the naked eye. The electroluminescent emission was observed to be stable in that no diminution of electroluminescence was observable to the naked eye over a test period of several hours. This compares with a lifetime of the order of a few seconds for luminescence associated with anodic oxidation in similar structures in the prior art. Furthermore, the silicon structure 12 used in the test was observed to emit undiminished photoluminescence when removed from the electrolyte 24 and exposed to UV light. Thus the electroluminescent emission was not the result of time-dependent chemical changes occurring to the passivated surface layer 22, which would produce emission reducing intensity with time. Instead, it is believed to be the result of injection of minority carriers, in this case holes, into the quantum wires 18 by persulphate ion ($S_2O_8^{2-}$) reduction. The achievement of electroluminescent emission visible to the naked eye from a silicon-based device at low applied voltages constitutes a major advance over the prior art.

Figure 2:
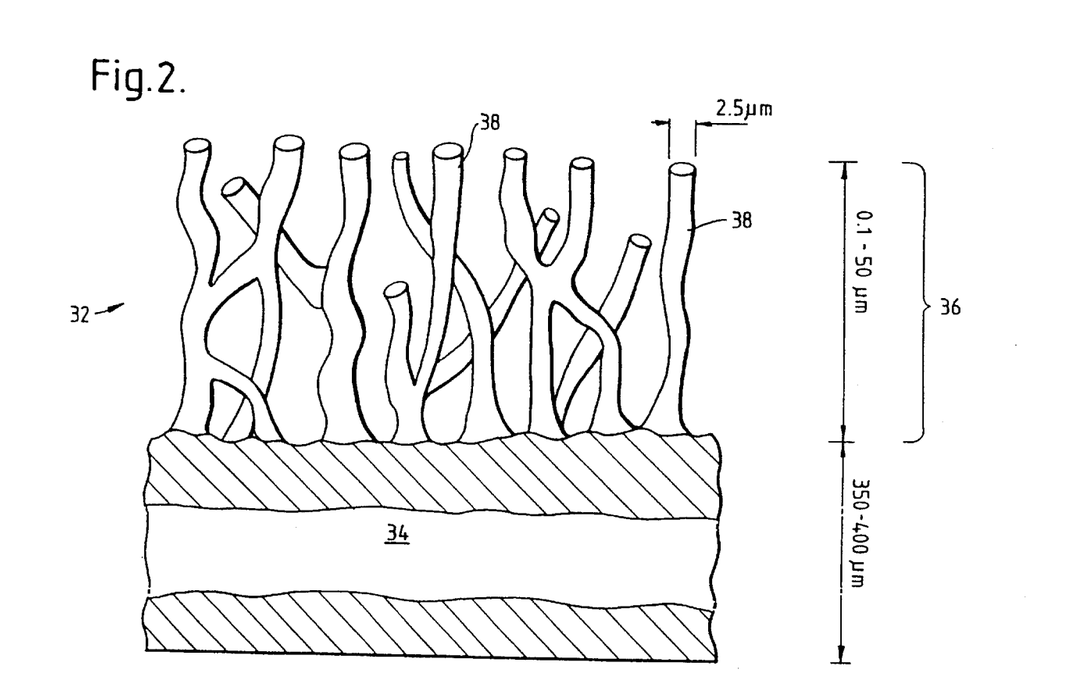
FIG. 2 illustrates connectivity and branching in quantum wires.

Referring now to FIG. 2, a cross-section through a silicon structure 32 is illustrated schematically. It is not shown to scale. The relative dimensions of individual regions have been altered to make features clear. The silicon structure 32 consists of an unetched part 34 of a bulk silicon wafer with thickness in the range 350–400 μm (shown in part only); the part 34 is referred to hereinafter as the "wafer 34". A silicon quantum wire layer 36 extends from the wafer 34, and is in the range 0.1 to 50 μm in thickness. The latter contains individual quantum wires such as 38 typically 2.5 nm in diameter. FIG. 2 illustrates wire connectivity and branching, and is a better diagrammatic representation of quantum wires produce by pore overlap than the equivalent wires 18 in the porous layer 16 in FIG. 1. However, silicon quantum wires have been observed to have microscopic roughness and undulating diameter which is not illustrated.

A second embodiment of the device 10 was constructed from a lightly doped n-type (n$^-$) silicon wafer with an arsenic donor concentration of $5 \times 10^{15}$ cm$^{-3}$. In this embodiment the porous layer 16 had a porosity of 76%, a thickness of 0.4 μm and had been aged in air for 17 months prior to immersion in electrolyte. The electrolyte was as used in the previous embodiment. When biased, with the silicon structure as the cathode, with a bias voltage of 1 Volt or greater, visible orange electroluminescence was observed.

A third embodiment of the device 10 was constructed from a heavily doped p-type (p$^+$) silicon wafer with a boron acceptor concentration of $5 \times 10^{18}$ cm$^{-3}$. In this embodiment the porous layer 16 had a porosity of 75% and a thickness of 4.3 μm, and had been aged in air for 15 months prior to immersion in electrolyte. The electrolyte was as in earlier embodiments. When biased with the silicon structure as the cathode, with a bias voltage of 5 Volts or greater, orange electroluminesence was observed. This bias polarity corresponded to a reverse biased silicon structure 12.

A fourth embodiment of the device 10 was constructed from a heavily doped p-type (p$^+$) silicon wafer with a boron acceptor concentration of $5 \times 10^{18}$ cm$^{-3}$ once more. In this embodiment the porous layer 16 had a porosity of 72% and a thickness of 1.2 μm, and had been aged for 16 months. When this embodiment was biased with the silicon structure as the cathode, and a bias voltage of 5 Volts or greater, it also exhibited visible orange electroluminescence.

For comparison purposes, a device was constructed which was equivalent to the device 10 except that it had a porosity which was deliberately arranged to be too low to produce a significant density of quantum wires. This comparison device was constructed from a heavily doped n-type (n$^+$) silicon wafer with an arsenic donor concentration of $5 \times 10^{18}$ cm$^{-3}$. It had a porous silicon layer with a porosity of 44% and a thickness of 5 μm, and had been aged in air for 17 months. It incorporated the same electrolyte and electrical connections as the device 10, and differed from the latter in the thickness and porosity of the porous silicon layer. It did not exhibit visible electroluminescence under cathodic bias with bias voltages up to 30 Volts. Moreover, the porous silicon layer in the comparison device did not exhibit visible photoluminescence either. This is believed to be due its much lower porosity (compared to the like for the device 10) indicating that it did not incorporate isolated quantum wires to any significant extent.

More generally, the material in which the silicon quantum wires are immersed need not be an electrolyte, but may be a conducting material such as a semiconductor, a semimetal, a metal or a conducting polymer. Whether it is an electrolyte or a conducting material of another kind, the material contacting the quantum wires should conform to certain criteria. These criteria are discussed below. They provide tests for suitability of conducting materials for incorporation in devices of the invention.

The conductive material should be amenable to a procedure for infiltration into the porous silicon layer 16 operative at low temperatures, i.e. below 300° C. At higher temperatures above 300° C., the surface passivation layer 22 is degraded, and photoluminescence from the porous layer 16 becomes wholly or partially quenched. In addition, at these higher temperatures, the porous layer 16 may begin to restructure itself increasing the width of the wires 18 and reducing their number. In consequence the quantum confinement of carriers may become lost. However, device production at higher temperatures is feasible if surface passivation and quantum confinement do not suffer serious degradation or if any such degradation is subsequently counteracted.

The conductive material should have a reasonable conductivity; however, it is not appropriate to define a minimum bulk conductivity which the material must have to be suitable for infiltration into the porous silicon layer. This is due to the conductivity of materials differing between their bulk states and their presence within pores. It is more appropriate to define a minimum current density that should be supported by the composite structure 25 (the combination of the silicon structure 12 and the conductive material 24). Indeed, the composite structure 25 should be sufficiently conductive to support current densities of the order of, or greater than, 1 mAcm$^{-2}$ at less than 10 Volts forward bias. Here current density is measured as previously described.

It must be possible either substantially to fill the pore volume with the conductive material, or at least to pervade the pore volume sufficiently for the material to be electrically continuous as described below. There must be good electrical connection between the electrical contact to the material (e.g. the electrode 26) and the bulk silicon. For this to be the case, it is not necessary for the conductive material to form a physically continuous layer which completely covers the surface layer 22. It is for example sufficient to form a network of the conductive material producing a good connection between the electrode and the silicon structure 12. The important thing is that the conductive material 24 provide contact to a substantial proportion of the quantum wire surfaces, enabling current to flow in the wires 18 under bias as required for electroluminescence to occur. The conductive material 24 enables substantial current densities to flow in the composite structure 25 at low voltages, e.g. less than 10 Volts. The conductive material 24 ensures that an electrically continuous conductive path is established from one device terminal (the electrode 26) to the other device terminal (the Ohmic connection 28) through the conductive material 24, the quantum wires 18 and the bulk silicon The conductive material 24 should form a stable interface with the oxidised silicon hydride surface layer 22, and should not significantly degrade the surface passivation provided by that layer. That is the porous layer 16 should still be capable of exhibiting photoluminescence after the conductive material has been infiltrated into the pores 20.

This provides a convenient quality control test of conductive material acceptability.

The conductive material should be capable of providing an enhanced density of minority carriers in the silicon quantum wires 18 when the device 10 is at low bias voltage. It may acheive this by injection of minority carriers with adequate efficiency into the quantum wires 18. Injection efficiency is frequently quantified using a minority carrier injection ratio g, defined as the ratio of the minority carrier current to the total current passing across the relevant junction, as described by S M Sze in "Physics of Semiconductor Devices", Wiley and Sons, New York (1981) p268.

The density of minority carriers in the quantum wires 18 may also be enhanced by hot carrier-induced impact ionisation. Hot majority carriers accelerated by high electric fields can create electron-hole pairs by across-the-band gap ionisation.

The expression "minority carriers" used in this specification is employed on the following basis: a particular carrier type, which is the majority carrier type, is responsible for the major proportion of the current flowing in the silicon quantum wipes 18 under applied bias. Minority carriers have opposite sign to majority carriers. Recombination of majority and minority carriers is believed to occur in the quantum wires 18, since electroluminescence is observed in them in embodiments of the invention. Since the quantum wires 18 have high resistivity as previously described, they do not appear to retain the electrical characteristics of the original silicon wafer from which they were formed. Consequently, the majority carrier type of the bulk silicon 14 (n type or p type) may the same as or opposite to that of the charge carriers giving rise to the majority carrier current flow in the quantum wires 18.

Normal metal-semiconductor junctions (Schottky barriers) usually exhibit very low minority carrier injection ratios, i.e. $10^{-5} < g < 10^{-3}$. For example, for a gold to bulk n-type silicon junction, with a doping level of $N_D = 10^{16}$ cm$^{-3}$, $g = 5 \times 10^{-5}$ under low bias voltage, as measured by A C Y Yu and E H Snow in "Minority Carrier Injection of Metal-Silicon Contacts", Solid State Electronics, Vol 12, P155 ( 1969). Incorporation of a thin insulating layer between the metal and semiconductor layers, to form a Metal-Insulator-Semiconductor (MIS) junction can increase the minority carrier injection ratio under low bias. Values of g as high as $10^{-1}$ at 2 Volts bias have been reported with bulk MIS silicon structures containing an interfacial oxide layer of optimum thickness, H C Card and E H Rhoderick, Solid State Electronics, Vol 16, p365 ( 1973). Still higher values of g are achievable with p-n homojunctions and heterojunctions. S R Morrison, in J. Appl. Phys., Vol 53, p123 (1982), has quantified hole injection into bulk n-type silicon from specific ions in solution. Strong oxidising agents such as persulphate ions are associated with hole states below the valence band edge of silicon and inject holes comparatively efficiently ($g=10^{-1}$) into silicon from HF-modified 0.1M solution in 1M NH$_4$F. In contrast weak oxidising agents such as protons are inefficient hole injectors giving rise to negligible minority carrier current ($g<10^{-5}$).

In devices of the invention minority carriers must be injected from the conductive material 24 into the silicon quantum wires 18. Published data described above relates to bulk silicon in various circumstances; there are no data published for the injection of minority carriers into silicon quantum wires. However, the material 24 should be capable of producing an injection ratio g into the wires 18, of at least $10^{-4}$ at bias voltages of 10 Volts or less. A material for which the injection ratio g is at least $10^{-4}$ at bias voltages at or below 10 Volts is capable of efficiently injecting minority carriers for the purposes of this specification.

Devices of the invention may be made from heavily doped n type or p type silicon material having a dopant impurity concentration which is greater than $1 \times 10^{18}$ cm$^{-3}$ and not greater than $1 \times 10^{21}$ cm$^{-3}$. They may also be made from lightly doped n type or p type silicon material having a dopant impurity concentration in the range $1 \times 10^{11}$ cm$^{-3}$ to $1 \times 10^{18}$ cm$^{-3}$.

Figure 3:
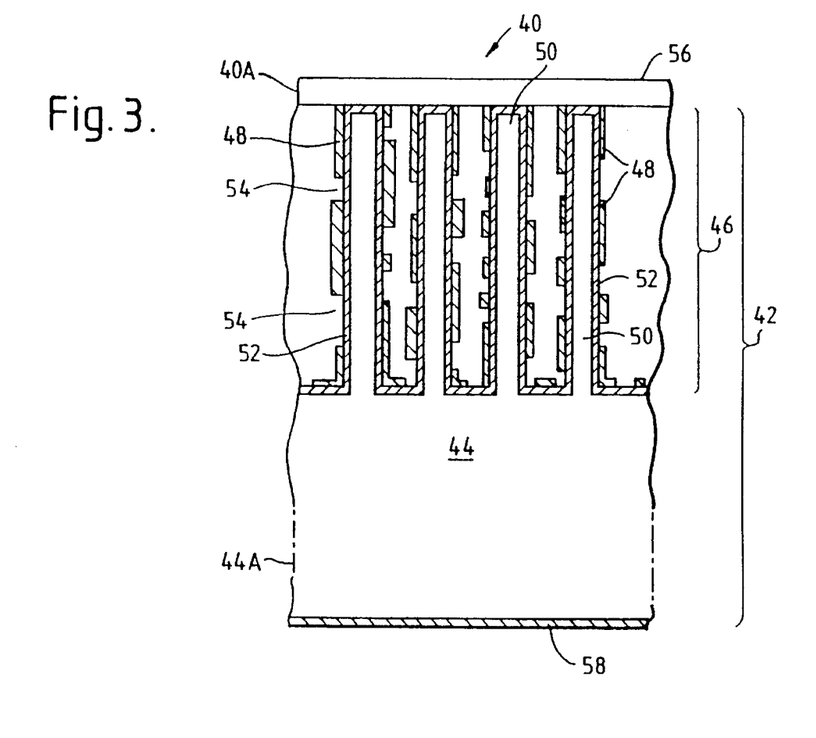
FIG. 3 illustrates schematically a vertical cross-section through a device of the invention incorporating metal electroplated into a porous silicon layer.

Referring now to FIG. 3, there is schematically shown a device of the invention indicated generally by 40 and incorporating conductive material in the form of metallisation. Laterally outer regions of the device 40 have been omitted as indicated by irregular edges such as 40A. The device 40 is shown in idealised form equivalent to FIG. 1. It includes a silicon structure 42 incorporating a bulk silicon wafer 44 and a porous silicon layer 46. The wafer 44 has a central region which is foreshortened as indicated by dotted lines 44A. The porous layer 46 is electroplated with metal 48, which replaces the electrolyte 24 of earlier embodiments. The porous layer 46 incorporates quantum wires such as 50 each with an interfacial oxide layer such as 52. The metal 48 forms a layer on the oxide 52,.and has discontinuities in it such as holes 54. The porous layer 46 is surmounted by a semitransparent conducting electrode layer 56, and the wafer 44 has an Ohmic contact 58.

A first embodiment of the device 40 was made as follows from a silicon wafer with a boron acceptor concentration of $4 \times 10^{18}$ cm$^{-3}$. The wafer was anodised in an electrolyte (hereinafter called electrolyte I) containing equal volumetric proportions of ethanol and an HF/water solution. the latter containing 40% by weight of HF. Anodisation was carried out at a current density of 100 mAcm$^{-2}$ for 15 secs in the dark. This produced a porous layer 46 with a thickness of 1 µm which was then annealed in air at 240° C. for 20 mins. The porous layer 46 gave visible photoluminescence under UV irradiation. The porous layer upper surface was then masked to expose only an area of 9 mm². Gold was electroplated into this area of the porous layer 46 from an aqueous solution containing 10 gm/liter of AuCl$_3$ and 2.9 gm/liter NaCl. A platinum anode was used. A current density of 10 mAcm$^{-2}$ was applied for a time of 45 seconds. This produced a composite of porous silicon plated with gold surmounted by a gold film about 0.2 µm thick.

Figure 4:
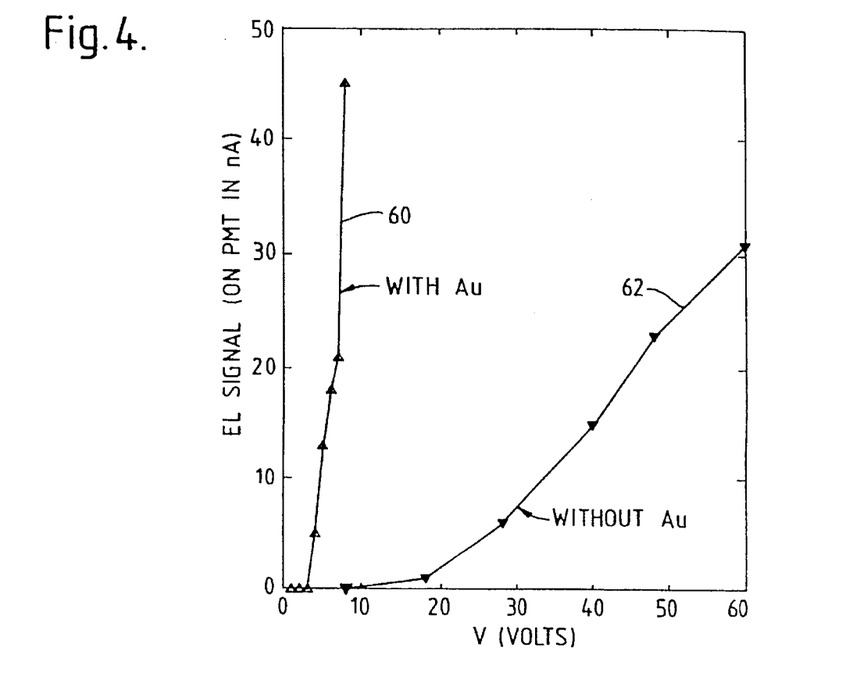
FIGS. 4 and 5 graphically illustrate electroluminescence and conduction properties of a device in accordance with FIG. 3 and a comparison device.
Figure 5:
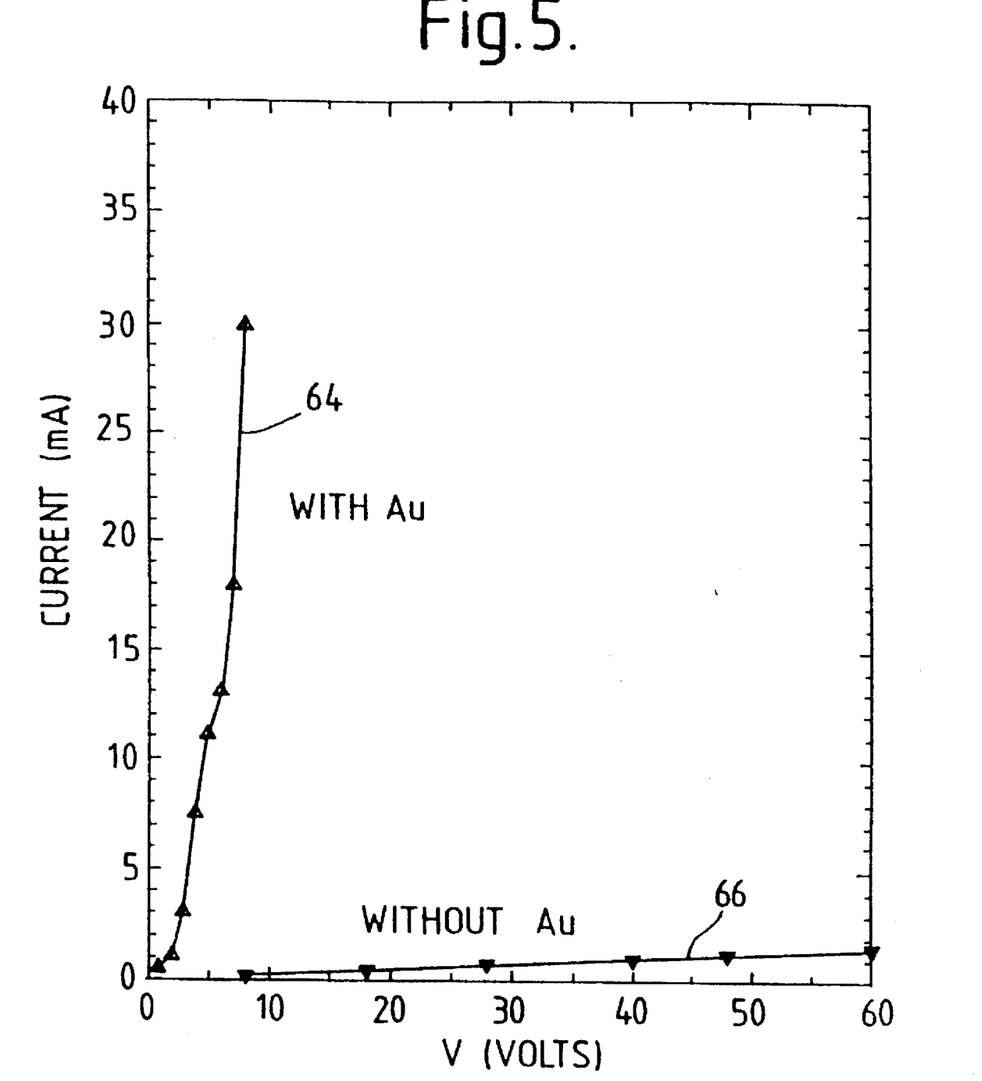

The electroluminescent and electrical properties of this first embodiment of the device 40 are shown in FIGS. 4 and 5 respectively, where they are compared with those of the porous layer 46 and silicon wafer 44 in the absence of electroplated gold. In each case, a transparent electrode was applied to the upper surface of the respective porous layer, over the gold plated region in one case. In both cases, a bias voltage was applied between the transparent electrode and an Ohmic contact on the wafer, the transparent electrode being positive and the Ohmic contact being negative. During current flow, electroluminescent emission from the porous layer 46 was monitored with a photomultiplier tube.

In FIG. 4, electroluminescence indicated by photomultiplier current in nanoAmps is plotted against bias voltage. Graphs 60 and 62 relate to the gold plated embodiment of the invention and to the comparison non-plated porous layer respectively. The graph 60 shows that the gold plated embodiment exhibits electroluminescence at bias voltages above 3 Volts, and electroluminescence increases rapidly with increasing bias voltage. The graph 62 shows that the non-plated porous layer exhibits no significant electroluminescence at bias voltages below 10 Volts, and electroluminescence increases only slowly with increasing bias voltage thereafter. The porous layer requires 60 Volts bias to exhibit electroluminescence shown by the gold plated embodiment at only about 8 Volts.

In FIG. 5, current in mAmps is plotted against bias voltage in graphs 64 and 66 for the gold plated embodiment of the invention and the comparison non-plated porous layer respectively. These graphs show that the gold plated embodiment exhibits much higher conductivity than the comparison non-plated porous layer.

Figure 6:
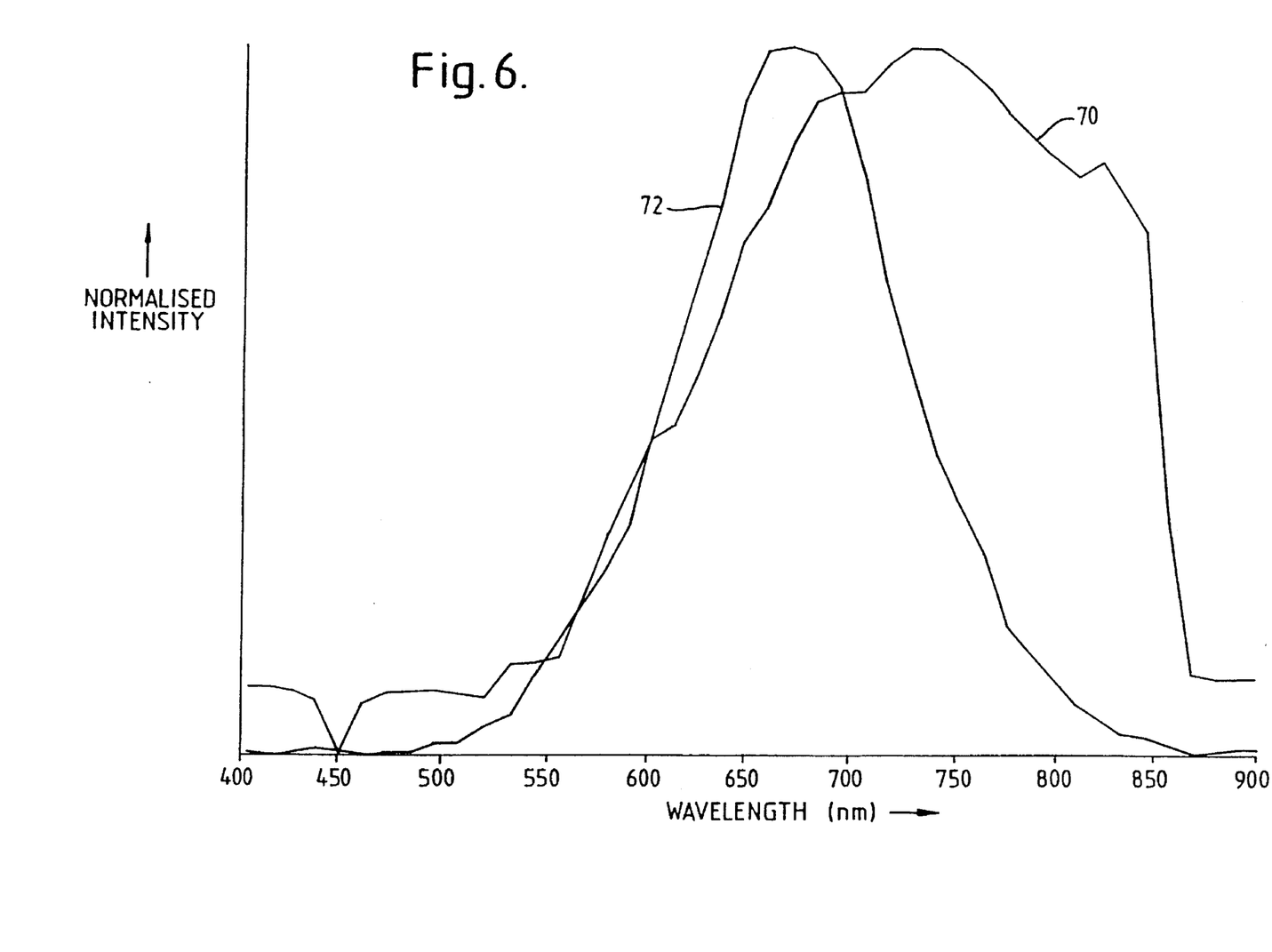
FIG. 6 graphically illustrates spectra of electroluminescence emission from an electroplated device of the invention and photoluminescence emission from a comparison porous silicon layer.

Referring now also to FIG. 6, there is shown a graph 70 of electroluminescence emission in arbitrary units plotted as a function of wavelength in nm for the gold plated embodiment of the invention referred to above. The graph 70 indicates that electroluminescence emission is largely in the range 550–850 nm, centred at about 760 nm. Blue light from an He-Cd laser was used to obtain photoluminescence from the comparison non-plated porous layer referred to above, and this provided a second graph 72 in FIG. 6. The graph 72 indicates that photoluminescence emission in the absence of plated metal was largely in the range 550–790 nm, centred at about 660 nm. The electroluminescence emission is therefore spectrally broader and shifted to longer wavelengths compared to the photoluminescence emission of the comparison layer. Both graphs 70 and 72 have normalised intensity values calculated by dividing actual intensity by peak intensity throughout.

As has been said, the first embodiment of the device 40 had an overlying gold film 0.2 µm thick, which is undesirably thick from the point of view of obtaining transparency to visible light. The composite was subjected to a low energy Argon ion etch to remove the overlying gold film. This greatly improved the visible photoluminescence obtainable from the porous layer 46 under blue laser irradiation.

A second embodiment of the device 40 was made as follows from an n$^+$ silicon wafer with an arsenic donor concentration of 8×10$^{18}$ cm$^{-3}$. The wafer was anodised in electrolyte I at a current density of 7.5 mAcm$^{-2}$ for 10 mins in the dark. It was then subjected to chemical dissolution at 27° C. for 6 hours in a second electrolyte containing equal volumetric proportions of ethanol and an HF/water solution, the latter containing 20% by weight of HF. It was then annealed in air at 200° C. for 2 hours. Fourier transform infra-red spectroscopy (FTIR) indicates that the anneal step produces a silicon oxide layer on exposed silicon surfaces. This series of steps produced a porous layer 46 which gave visible photoluminescence under UV irradiation. The porous layer upper surface was then masked to expose an area of 9 mm². Gold was electroplated into this area of the porous layer 66 from an aqueous solution containing 10 gm/liter of AuCl$_3$ and 2.9 gm/liter NaCl. A current density of 1 mAcm$^{-2}$ was applied for a time of 10 mins. This produced a composite of porous silicon plated with gold surmounted by a somewhat discoloured gold film. Electroluminescence was also obtained from this embodiment after electroding and under bias as described for the previous embodiment.

A further embodiment of the invention was produced which was equivalent to the device 40, except that it was not annealed to produce an oxide layer 52. It was made as follows from an n* silicon wafer with an arsenic donor concentration of 8×10$^{18}$ cm$^{-3}$. The wafer was anodised in electrolyte I at a current density of 7.5 mAcm$^{-2}$ for 10 mins in the dark. It was then subjected to chemical dissolution at 27° C. for 5 hours in electrolyte I. This series of steps produced a porous layer which gave visible photoluminescence under UV irradiation. The porous layer upper surface was then masked to expose an area of 9 mm². Tin was electroplated into this area of the porous layer 66 from an acidic (H$_2$SO$_4$) aqueous solution containing 13 gm/liter of SnSO$_4$, 0.4 gm/liter of gelatin, 0.2 gm/liter of β-naphthene and 50 vol. % ethanol. A pure tin anode was used. A current density of 1 mAcm$^{-2}$ was applied for a time of 30 mins. This produced a composite of porous silicon plated with tin surmounted by a grey film of tin. The composite was dried at 110° C. for 10 mins. Electroluminescence was obtained from this embodiment after electroding and under bias as described for earlier embodiments.

Electroplating of tin into a porous layer of heavily doped n-type silicon of approximately 5 µm thickness was also carried out for the purposes of investigating evenness of the distribution of tin as a function of depth.

Electroplating of metal into porous silicon is known to be difficult to acheive with acceptable depth uniformity. This is described by R Herino, P Jan and G Bomchil in "Nickel Plating on Porous Silicon", J. Electrochem. Soc.:Solid-State Science and Technology, Vol 132, p2513 (1985); their results show that they encountered difficulty in obtaining an even depth distribution of nickel through porous layers thicker than 1 µm or so.

To investigate uniformity of metal deposition as a function of depth, an aged porous silicon test layer (porosity 64%) and a pure tin anode were immersed in a HCl/SnCl$_2$ electroplating solution. A bias voltage was applied with a polarity appropriate for the silicon to form the cathode. The current density was gradually ramped up from a few µAcm$^{-2}$ to a few mAcm$^{-2}$ over a period of the order of eight hours.

Figure 7:
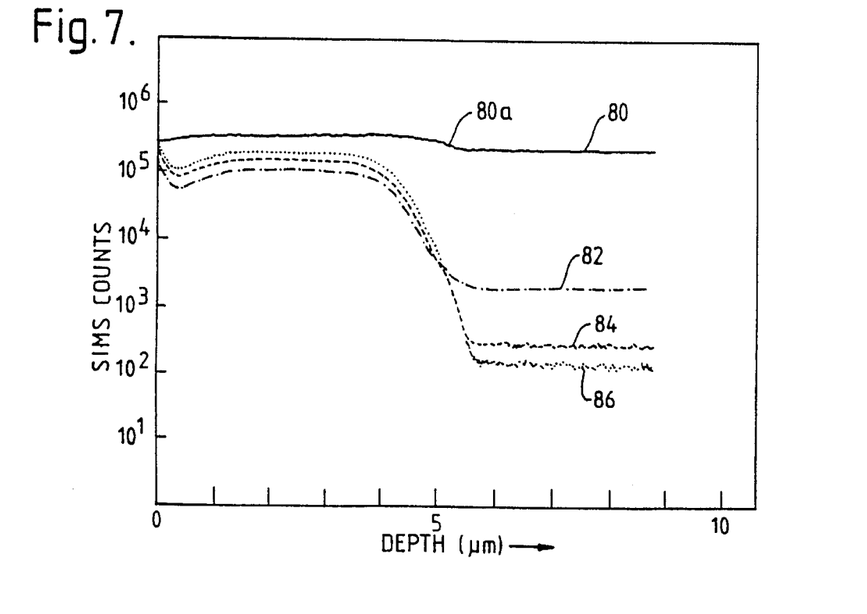
FIG. 7 graphically illustrates the distribution of electroplated tin as a function of depth in a porous silicon layer.

Referring now to FIG. 7, results of a Secondary Ion Mass Spectroscopy (SIMS) analysis showing tin deposition throughout a relatively thick porous silicon test layer are illustrated graphically. Curve 80 shows the distribution of $^{30}$Si with depth, curve 82 that of $^{116}$Sn, curve 84 that of $^{118}$Sn and curve 86 that of $^{120}$Sn. Curve 80 has a dip 80a at the point corresponding to the thickness of the porous test layer. The curves 82, 84 and 86 show that tin has been deposited fairly uniformly through the greater proportion of the thickness of the porous test layer. SIMS is susceptible to interference. To check on its reliability in this use, the ratio of measured $^{120}$Sn to measured $^{118}$Sn within the thickness of the porous test layer was calculated. The ratio was found to be 1.4 which is correct for naturally occurring tin.

Prior to electroplating, the porous silicon test layer exhibited visible photoluminescence when under ultra violet illumination. After being electroplated with tin the porous test layer still exhibited this photoluminescence, which indicated that the surface passivation of the test layer had not been significantly degraded by the process.

Figure 8A:
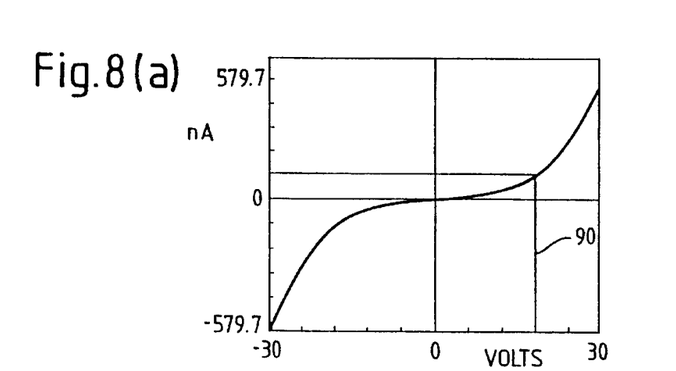
FIG. 8(a) shows the variation of current with voltage across a non-electroplated area of a porous silicon layer.
Figure 8B:
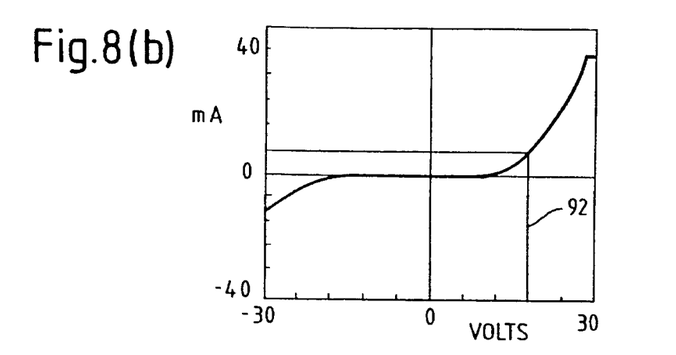
FIG. 8(b) shows the variation of current with voltage across an area of a porous silicon layer which has been electroplated with tin.

The electrical properties of the test layer were also investigated. Aluminium dots were sintered at 250° C. to both unplated and plated samples of the test layer such that electrical connections could be made across the test layer in each case. Referring now to FIG. 8, current versus voltage plots for (a) an unplated area, and (b) a tin plated area of the test layer are shown. Comparing results for unplated and plated areas indicates that the conductivity of the test layer is significantly greater in the latter. For instance, at 18 V bias the current flow through the unplated area of the test layer is of the order of 0.1 μA, as indicated by a line 90 in FIG. 8(*a*). In comparison, the equivalent for the plated area of the test layer, indicated in FIG. 8(*b*) by a line 92, is of the order of 10 mA. The current through the plated area is therefore greater by a factor of $10^5$ than the current through the unplated area. This clearly illustrates that tin electroplated into a porous silicon layer forms an electrically continuous layer as discussed earlier. However the extent to which it fills the pores between the silicon quantum wires, or covers the surface passivation layer is not known.

The method of electroplating a metal into porous silicon layers consisting of quantum wires is not limited to the impregnation of gold and tin. However, the electroplating solution used must wet the pores sufficiently, at least under bias when electrocapillarity occurs, for an electrically continuous layer of the metal to be formed.

In some circumstances electroplating may be performed in the same solution as fabrication of the quantum wire array by etching of a porous silicon layer. This provides the advantage of not requiring a delicate silicon structure to be removed from the etching solution and dried before further processing is performed. Moreover, as indicated above for embodiments incorporating electroplated gold, surface passivation may be performed entirely by eletrochemical processing, instead of partly by such processing followed by ageing or annealing in air or in a gaseous or vapour medium of another kind.

We claim:

1. An electroluminescent silicon device comprising a composite structure of silicon material incorporating a region of porous silicon containing surface passivated luminescent quantum wires, and conductive material within the porous region, wherein the conductive material comprises a means for enhancing conduction through the quantum wires, for not degrading the quantum wire surface passivation sufficiently to render the quantum wires non-luminescent, and for enhancing the minority carrier density within the quantum wires.

2. An electroluminescent silicon device comprising a composite structure of silicon material incorporating a region of porous silicon containing surface passivated luminescent quantum wires, and conductive material within the porous region, wherein the conductive material comprises a means for ensuring that an electrically continuous current path extends through the porous region, for not degrading the quantum wire surface passivation sufficiently to render the quantum wires non-luminescent, and for injecting minority carriers into the quantum wires.

3. An electroluminescent silicon device comprising a composite structure of a porous silicon layer comprising quantum wires with surface passivation and a conductive material, where the conductive material forms an electrically continuous layer over the internal surface of the porous silicon layer, and comprises a means for not degrading the surface passivation of the porous silicon layer, and for efficiently injecting minority carriers into the quantum wires.

4. An electroluminescent silicon device according to claim 1, wherein the composite structure is capable of supporting a current density of at least 1 mAcm$^{-2}$ under a bias voltage of not more than 10 Volts.

5. An electroluminescent silicon device according to claim 4 wherein the composite structure is capable of supporting a current density of at least 1 mAcm$^{-2}$ under a bias voltage of not more than 5 Volts.

6. An electroluminescent silicon device according to claim 1 wherein the conductive material is an electrolyte.

7. An electroluminescent silicon device according to claim 1 wherein the conductive material is a metal or a semi-metal.

8. An electroluminescent silicon device according to claim 1 wherein the porous silicon extends from heavily doped n type bulk silicon material having a donor concentration which is greater than $1\times10^{18}$ cm$^{-3}$ and not greater than $1\times10^{21}$ cm$^{-3}$.

9. An electroluminescent silicon device according to claim 1 wherein the porous silicon extends from lightly doped n type bulk silicon material having a donor concentration in the range $1\times10^{11}$ cm$^{-3}$ to $1\times10^{18}$ cm$^{-3}$.

10. An electroluminescent silicon device according to claim 1 wherein the porous silicon extends from heavily doped p type bulk silicon material having an acceptor concentration which is greater than $1\times10^{18}$ cm$^{-3}$ and not greater than $1\times10^{21}$ cm$^{-3}$.

11. An electroluminescent silicon device according to claim 1 wherein the porous silicon extends from lightly doped p type bulk silicon material having an acceptor concentration in the range $1\times10^{11}$ cm$^{-3}$ to $1\times10^{18}$ cm$^{-3}$.

12. An electroluminescent silicon device made by the method of forming a composite structure comprising a porous silicon layer having quantum wires with surface passivation and a conducting material.

13. An electroluminescent silicon device comprising:

(a) silicon material having a porous region comprised of surface passivated luminescent silicon quantum wires;

(b) conductive material within the porous region comprising a means for enhancing electrical conduction through the quantum wires without degrading the quantum wire surface passivation sufficiently to render the quantum wires non-luminescent and for enhancing a minority carrier density within the quantum wires; and (c) electrical connections to the silicon material and the conductive material.

14. An electroluminescent silicon device comprising:

(a) silicon material having a porous region comprised of surface passivated luminescent silicon quantum wires;

(b) conductive material within the porous region comprising a means for ensuring that an electrically continuous current path extends through the porous region without degrading the quantum wire surface passivation sufficiently to render the quantum wires non-luminescent and for injecting minority carriers into the quantum wires; and (c) electrical connections to the silicon material and the conductive material.

15. An electroluminescent silicon device comprising:

(a) silicon material having a porous region comprised of surface passivated luminescent silicon quantum wires;

(b) conductive material forming an electrically continuous layer over an internal surface of the porous region comprising a means for not degrading the quantum wire surface passivation sufficiently to render the quantum wires non-luminescent and for efficiently injecting minority carriers into the quantum wires; and (c) electrical connections to the silicon material and the conductive material.

16. An electroluminescent silicon device according to claim 13 wherein the device is capable of supporting a current density of at least 1 mAcm$^{-2}$ under a bias voltage of not more than 10 volts.

17. An electroluminescent silicon device according to claim 16 wherein the device is capable of supporting a current density of at least 1 mAcm$^{-2}$ under a bias voltage of not more than 5 volts.

18. An electroluminescent silicon device according to claim 13 wherein the conductive material is an electrolyte.

19. An electroluminescent silicon device according to claim 13 wherein the conductive material is a metal or a semi-metal.

20. An electroluminescent silicon device according to claim 13 wherein the porous silicon extends from heavily doped n type bulk silicon material having a donor concentration which is greater than $1\times10^{18}$ cm$^{-3}$ and not greater than $1\times10^{21}$ cm$^{-3}$.

21. An electroluminescent silicon device according to claim 13 wherein the porous silicon extends from lightly doped n type bulk silicon having a donor concentration in the range of $1\times10^{11}$ cm$^{-3}$ to $1\times10^{18}$ cm$^{-3}$.

22. An electroluminescent silicon device according to claim 13 wherein the porous silicon extends from heavily doped p type bulk silicon having an acceptor concentration which is greater than $1\times10^{18}$ cm$^{-3}$ and not greater than $1\times10^{21}$ cm$^{-3}$.

23. An electroluminescent silicon device according to claim 13 wherein the porous silicon extends from lightly doped p type bulk silicon having an acceptor concentration in the range $1\times10^{11}$ cm$^{-3}$ to $1\times10^{18}$ cm$^{-3}$.

24. An electroluminescent silicon device according to claim 14 wherein the porous silicon extends from heavily doped n type bulk silicon material having a donor concentration which is greater than $1\times10^{18}$ cm$^{-3}$ and not greater than to $1\times10^{21}$ cm$^{-3}$.

25. An electroluminescent silicon device according to claim 14 wherein the porous silicon extends from heavily doped p type bulk silicon having an acceptor concentration which is greater than $1\times10^{18}$ cm$^{-3}$ and not greater than $1\times10^{21}$ cm$^{-3}$.

26. An electroluminescent silicon device according to claim 14 wherein the porous silicon extends from lightly doped n type bulk silicon having a donor concentration in the range $1\times10^{11}$ cm$^{-3}$ to $1\times10^{18}$ cm$^{-3}$.

27. An electroluminescent silicon device according to claim 15 wherein the porous silicon extends from heavily doped n type bulk silicon material having a donor concentration which is greater than $1\times10^{18}$ cm$^{-3}$ and not greater than to $1\times10^{21}$ cm$^{-3}$.

28. An electroluminescent silicon device according to claim 15 wherein the porous silicon extends from heavily doped p type bulk silicon having an acceptor concentration which is greater than $1\times10^{18}$ cm$^{-3}$ and not greater than $1\times10^{21}$ cm$^{-3}$.

29. An electroluminescent silicon device according to claim 15 wherein the porous silicon extends from lightly doped n type bulk silicon having a donor concentration in the range $1\times10^{11}$ cm$^{-3}$ to $1\times10^{18}$ cm$^{-3}$.

30. An electroluminescent silicon device in accordance with claim 12 wherein said conducting material is in contact with said porous silicon layer.

31. An electroluminescent silicon device characterized in that it includes silicon quantum wires (18) and conducting means (24) for supplying an electrical current to the quantum wires (18), the quantum wires (18) and the conducting means (24) being arranged in combination to produce electroluminescence.

* * * * *